(12) United States Patent
Kwon et al.

(10) Patent No.: US 8,174,881 B2
(45) Date of Patent: May 8, 2012

(54) TECHNIQUES FOR REDUCING DISTURBANCE IN A SEMICONDUCTOR DEVICE

(75) Inventors: Jungtae Kwon, San Jose, CA (US); David Kim, Cupertino, CA (US); Sunil Bhardwaj, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 12/624,856

(22) Filed: Nov. 24, 2009

(65) Prior Publication Data

US 2011/0122687 A1 May 26, 2011

(51) Int. Cl.
*G11C 11/34* (2006.01)
(52) U.S. Cl. .................................. 365/185.02
(58) Field of Classification Search ............. 365/185.02, 365/185.25
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |

(Continued)

FOREIGN PATENT DOCUMENTS

CA 272437 7/1927

(Continued)

OTHER PUBLICATIONS

Tanabe et al., A 30-ns. 64-MB DRAM with Built-in-Self-Test and Self-Repair Function, IEEE Journal of Solid State Circuits, vol. 27, No. 11, pp. 1525-1533, Nov. 1992.

(Continued)

*Primary Examiner* — Hoai V Ho
*Assistant Examiner* — Min Huang
(74) *Attorney, Agent, or Firm* — Wilmer Cutler Pickering Hale and Dorr LLP

(57) ABSTRACT

Techniques for reducing disturbance in a semiconductor memory device are disclosed. In one particular exemplary embodiment, the techniques may be realized as a semiconductor memory device having reduced disturbance. The semiconductor memory device may comprise a plurality of memory cells arranged in arrays of rows and columns. The semiconductor memory device may also comprise a plurality of data sense amplifiers, coupled to the plurality of memory cells, configured to perform one or more operations during an operation/access cycle, wherein the operation/access cycle may comprise an operation segment and a disturbance recovery segment.

20 Claims, 4 Drawing Sheets

U.S. PATENT DOCUMENTS

| | | |
|---|---|---|
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,963,473 A * | 10/1999 | Norman ............... 365/185.02 |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |

| | | |
|---|---|---|
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,652,908 B2* | 1/2010 | Miyamoto et al. ............ 365/145 |
| 7,688,629 B2* | 3/2010 | Kim ........................ 365/185.11 |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2006/0256606 A1* | 11/2006 | Park ............................ 365/100 |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0144378 A1* | 6/2008 | Park et al. ................. 365/185.05 |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |

| | | |
|---|---|---|
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | 01/24268 | 4/2001 |
| WO | 2005/008778 | 1/2005 |

OTHER PUBLICATIONS

Ban et al., Integration of Back-Gate Doping for 15-nm Node Floating Body Cell (FBC) Memory, Components Research, Process Technology Modeling, presented in the 2010 VLSI Symposium on Jun. 17, 2010.
Arimoto et al., A Configurable Enhanced T2RAM Macro for System-Level Power Management Unified Memory, 2006, VLSI Symposium.
Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06. International, IEEE, Dec. 11-13, 2006.
Bawedin, Maryline, et al., A Capacitorless 1T DRAM on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. On El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Giga-bit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces Responsible for Junction Leakage on SOI, May 2009, ICSI.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two- Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers,. pp. 141-142, 1995.

Nagoga, Studying of Hot Carrier Effect in Floating Body SOI Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562μm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less DRAM Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15µ m SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., a Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

* cited by examiner

TECHNIQUES FOR REDUCING DISTURBANCE IN A SEMICONDUCTOR DEVICE

FIELD OF THE DISCLOSURE

The present disclosure relates generally to semiconductor memory devices and, more particularly, to techniques for reducing a disturbance in a semiconductor memory device.

BACKGROUND OF THE DISCLOSURE

There is a continuing trend to employ and/or fabricate advanced integrated circuits using techniques, materials, and devices that improve performance, reduce leakage current, and enhance overall scaling. In one conventional technique, a memory cell of a semiconductor memory device having one or more memory transistors may be read by applying a bias to a drain region of a memory transistor, as well as a bias to a gate of the memory transistor that is above a threshold voltage of the memory transistor. As such, conventional reading techniques sense an amount of channel current provided/generated in response to the application of the bias to the gate of the memory transistor to determine a state of the memory cell. For example, an electrically floating body region of the memory cell may have two or more different current states corresponding to two or more different logical states (e.g., two different current conditions/states corresponding to two different logic states: binary "0" data state and binary "1" data state).

Also, conventional writing techniques for memory cells having an N-Channel type memory transistor typically result in an excess of majority charge carriers by channel impact ionization or by band-to-band tunneling (gate-induced drain leakage "GIDL"). The majority charge carriers may be removed via drain side hole removal, source side hole removal, or drain and source hole removal, for example, using back gate pulsing.

Often, conventional reading and/or writing techniques may lead to relatively large power consumption and large voltage swings which may cause disturbance to memory cells on unselected rows in the memory device. Also, pulsing between positive and negative gate biases during read and write operations may reduce a net quantity of charge carriers in a body region of a memory cell in the semiconductor memory device, which, in turn, may gradually eliminate data stored in the memory cell. In the event that a negative voltage is applied to a gate of a memory cell transistor, thereby causing a negative gate bias, a channel of minority charge carriers beneath the gate may be eliminated. However, some of the minority charge carriers may remain "trapped" in interface defects. Some of the trapped minority charge carriers may recombine with majority charge carriers, which may be attracted to the gate, and the net charge in majority charge carriers located in the floating body region may decrease over time. This phenomenon may be characterized as charge pumping, which is a problem because the net quantity of charge carriers may be reduced in the memory cell, which, in turn, may gradually eliminate data stored in the memory cell.

Additionally, conventional reading and/or writing techniques may lead to disturbance (e.g., influence a data state stored in a memory cell) in one or more unselected memory cells. For example, a plurality of memory cells may be coupled to a common source line (SL). Although, a single memory cell may be selected for a read and/or a write operations, all memory cells coupled to the source line (SL) may receive a voltage applied to the source line (SL). Therefore, one or more unselected memory cells coupled to the source line (SL) may be disturbed (e.g., influence an amount of charged stored in the memory cells) by a voltage applied to the source line (SL).

In view of the foregoing, it may be understood that there may be significant problems and shortcomings associated with conventional techniques for reading from and/or writing to semiconductor memory devices.

SUMMARY OF THE DISCLOSURE

Techniques for reducing disturbance in a semiconductor memory device are disclosed. In one particular exemplary embodiment, the techniques may be realized as a semiconductor memory device having reduced disturbance. The semiconductor memory device may comprise a plurality of memory cells arranged in arrays of rows and columns. The semiconductor memory device may also comprise a plurality of data sense amplifiers, coupled to the plurality of memory cells, configured to perform one or more operations during an operation/access cycle, wherein the operation/access cycle may comprise an operation segment and a disturbance recovery segment.

In accordance with other aspects of this particular exemplary embodiment, the plurality of data sense amplifiers may comprise a plurality of local data sense amplifiers coupled a plurality of global data sense amplifiers via one or more global bit lines.

In accordance with further aspects of this particular exemplary embodiment, the plurality of local data sense amplifiers may be arranged in one or more local data sense amplifier subarrays 0 and one or more local data sense amplifier subarrays 1, and the plurality of global data sense amplifiers may be arranged in one or more global data sense amplifier subarrays 0 and one or more global data sense amplifier subarrays 1.

In accordance with additional aspects of this particular exemplary embodiment, the plurality of local data sense amplifiers may be coupled to a single global data sense amplifier via a single global bit line.

In accordance with other aspects of this particular exemplary embodiment, the plurality of local data sense amplifiers may be configured to determine a data state stored in one or more selected memory cells during the operation segment of the operation/access cycle.

In accordance with other aspects of this particular exemplary embodiment, the plurality of local data sense amplifiers may be configured to transfer the data state stored in the one or more selected memory cells to the plurality of global data sense amplifiers.

In accordance with further aspects of this particular exemplary embodiment, the plurality of local data sense amplifiers may be configured to determine a data state stored in one or more unselected memory cells.

In accordance with additional aspects of this particular exemplary embodiment, the plurality of local data sense amplifiers may be configured to writeback the determined data state to the one or more unselected memory cells.

In accordance with yet another aspect of this particular exemplary embodiment, the plurality of global data sense amplifiers may be configured to transfer the data state of the one or more selected memory cells back to the plurality of local data sense amplifiers.

In accordance with other aspects of this particular exemplary embodiment, disturbance recovery segment of the operation/access cycle may comprise a read operation and a writeback operation.

In accordance with further aspects of this particular exemplary embodiment, may further comprise a disturb recovery address counter configured to provide disturb recovery row address to the plurality of memory cells.

In another particular exemplary embodiment, the techniques may be realized as a method reducing disturbance in a semiconductor memory device. The method may comprise the step of providing a plurality of memory cells in arrays of rows and columns. The method may also comprise the step of performing one or more operations during an operation/access cycle, via a plurality of data sense amplifiers, on the plurality of memory cells, wherein the operation/access cycle may comprise an operation segment and a disturbance recovery segment.

In accordance with other aspects of this particular exemplary embodiment, the one or more operations may be performed during the operation segment of the operation/access cycle and the disturbance recovery segment may include a read operation and a write operation.

In accordance with further aspects of this particular exemplary embodiment, the plurality of data sense amplifiers may include a plurality of local data sense amplifiers and a plurality of global data sense amplifiers.

In accordance with additional aspects of this particular exemplary embodiment, the method may further comprise the step of determining a data state stored in one or more selected memory cells, via the plurality of local data sense amplifiers, during the operation segment of the operation/access cycle.

In accordance with yet another aspects of this particular exemplary embodiment, the method may further comprise transferring the data state stored in the one or more selected memory cells to the plurality of global data sense amplifiers.

In accordance with other aspects of this particular exemplary embodiment, the method may further comprise determining a data state stored in one or more unselected memory cells via the plurality of local data sense amplifiers.

In accordance with further aspects of this particular exemplary embodiment, the method may further comprise writing the determined data state back to the one or more unselected memory cells.

In accordance with additional aspects of this particular exemplary embodiment, the method may further comprise transferring the data state of the one or more selected memory cells from the global data sense amplifiers back to the plurality of local data sense amplifiers.

In accordance with yet another aspects of this particular exemplary embodiment, the method may further comprise providing a disturb recovery row address to the plurality of memory cells via a disturb recovery address counter.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

There are many embodiments described and illustrated herein. In one aspect, the present disclosures is directed to a combination of disturbance mitigation schemes which allow refresh and/or recovery of data states stored in a memory cell of a semiconductor memory device, and thereby reducing disturbance to surrounding memory cells.

Figure 1:
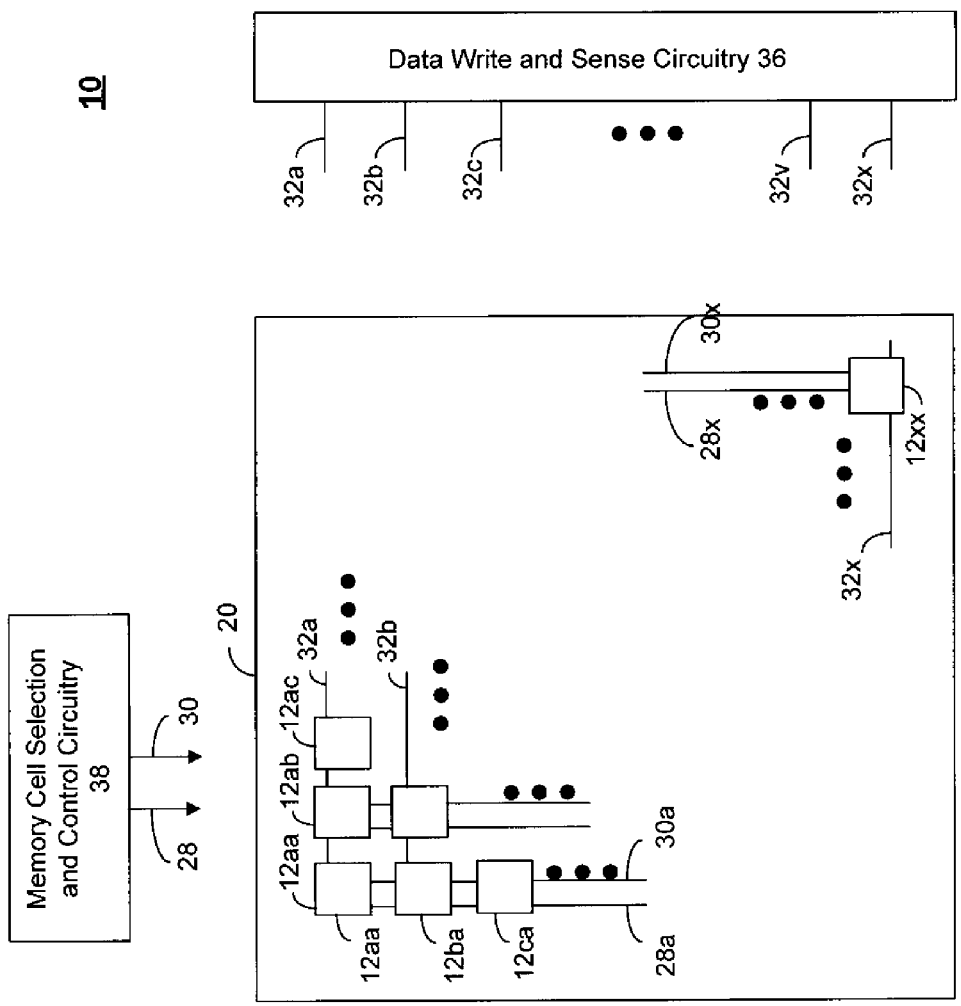
FIG. 1 shows a schematic block diagram of a semiconductor memory device including a memory cell array, data write and sense circuitry, and memory cell selection and control circuitry in accordance with an embodiment of the present disclosure.

Referring to FIG. 1, there is shown a schematic block diagram of a semiconductor memory device 10 comprising a memory cell array 20, data sense and write circuitry 36, and memory cell selection and control circuitry 38 in accordance with an embodiment of the present disclosure. The memory cell array 20 may comprise a plurality of memory cells 12 each coupled to a source line (SL) 30, a word line (WL) 28, and a bit line (BL) 32. The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (EL) 32 and a current or voltage reference signal. For example, each data sense amplifier may be a cross-coupled type sense amplifier to sense a data state stored in a memory cell 12.

Each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 contains a logic high (binary "1" data state) or a logic low (binary "0" data state). It may be appreciated by one having ordinary skill in the art that any type or form of data write and sense circuitry 36 (including one or more sense amplifiers, using voltage or current sensing techniques, to sense a data state stored in a memory cell 12) to read data stored in memory cells 12 and/or write data to memory cells 12 may be employed.

Also, the memory cell selection and control circuitry 38 may select and/or enable one or more predetermined memory cells 12 to facilitate reading data therefrom and/or writing data thereto by applying control signals on one or more word lines (WL) 28 and/or source lines (SL) 30. The memory cell selection and control circuitry 38 may generate such control signals using address data, for example, row address data. Moreover, the memory cell selection and control circuitry 38 may include a word line decoder and/or driver. For example, the memory cell selection and control circuitry 38 may include one or more different control/selection techniques (and circuitry therefor) to select and/or enable one or more predetermined memory cells 12. Such techniques, and circuitry therefor, should be well known to those skilled in the art. Notably, all such control/selection techniques, and circuitry therefor, whether now known or later developed, are intended to fall within the scope of the present disclosure.

In an exemplary embodiment, the semiconductor memory device 10 may implement a two step write operation whereby all memory cells 12 in a row of memory cells 12 are first written to a predetermined data state by first executing a "clear" operation, whereby all of the memory cells 12 in the row of memory cells 12 are written to logic low (binary "0" data state). Thereafter, selected memory cells 12 in the row of memory cells 12 are selectively written to the predetermined data state (e.g., logic high (binary "1" data state)). The semiconductor memory device may also implement a one step write operation whereby selective memory cells 12 in a row of memory cells 12 are selectively written to either a logic high (binary "1" data state) or a logic low (binary "0" data state) without first implementing a "clear" operation. The semiconductor memory device 10 may employ any of the exemplary writing, holding, and/or reading techniques described herein.

The memory cells 12 may comprise N-channel, P-channel and/or both types of transistors. Indeed, circuitry that is peripheral to the memory array 20 (for example, sense amplifiers or comparators, row and column address decoders, as well as line drivers (not illustrated herein)) may include P-channel and/or N-channel type transistors. Where P-channel type transistors are employed in memory cells 12 in the memory array 20, suitable write and read voltages (for example, negative voltages) should be well known to those skilled in the art in light of this disclosure. Accordingly, for sake of brevity, a discussion of such suitable voltages will not be included herein.

Figure 2:
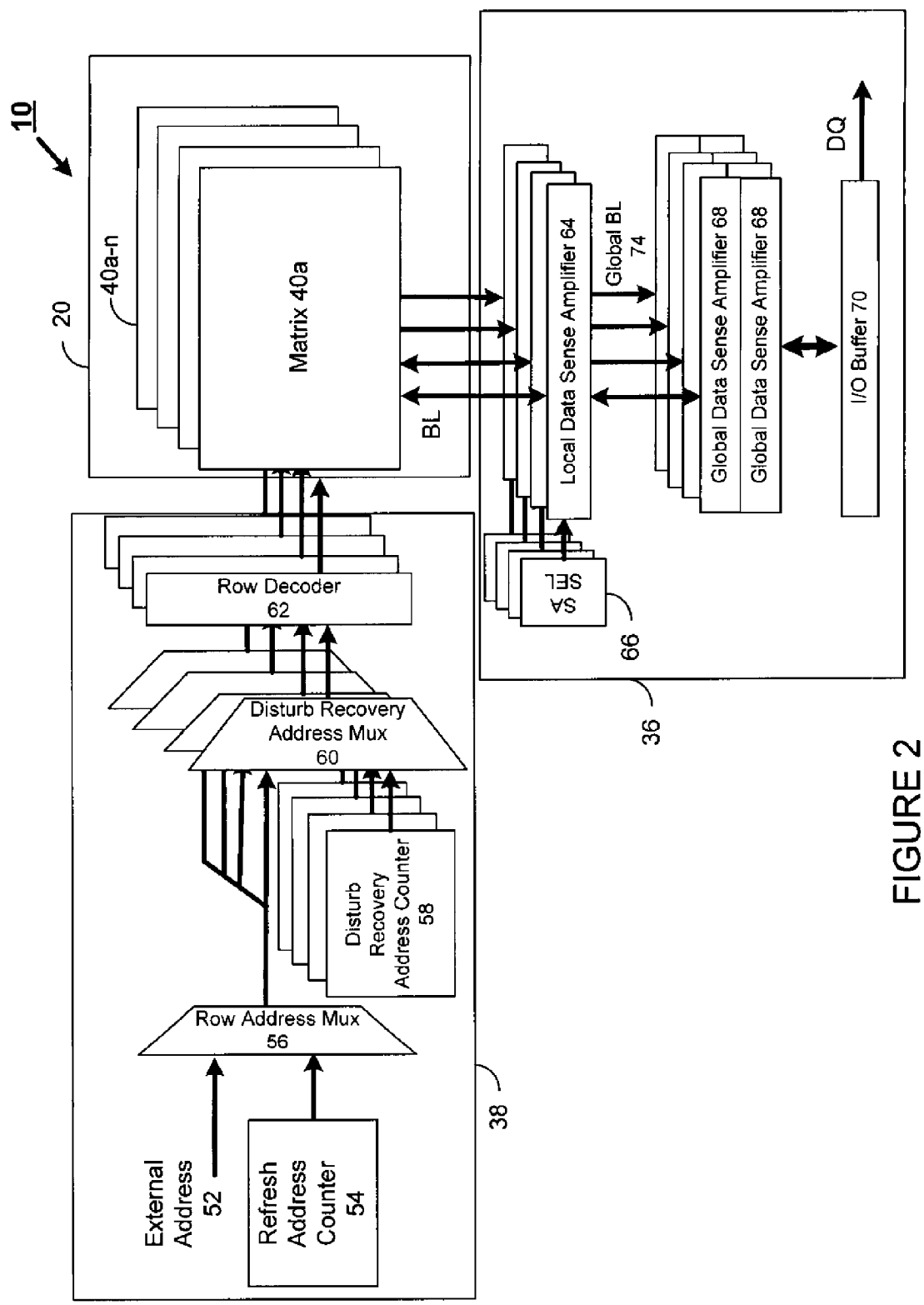
FIG. 2 shows a more detailed schematic block diagram of a semiconductor memory device in accordance with an embodiment of the present disclosure.

Referring to FIG. 2, there is shown a detailed schematic block diagrams of the semiconductor memory device 10 in accordance with an embodiment of the present disclosure. The semiconductor memory device 10 may include a memory cell array 20 having a plurality of matrices 40*a-n*. Each of the plurality of matrices 40*a-n* may include a plurality of memory cells 12 arranged in arrays of rows and columns. The semiconductor memory device 10 may also include memory cell selection and control circuitry 38 having an external address input 52, a refresh address counter 54, a row address multiplexer 56, one or more disturb recovery address counters 58, one or more disturb recovery address multiplexers 60, and/or one or more row decoders 62.

In order to enable one or more memory cells 12 to be refreshed during a refresh cycle, one or more refresh control signals may be applied to the memory cells 12. A row address corresponding to memory cells 12 to be refreshed may be identified by the refresh address counter 54. The refresh address counter 54 may be coupled to the row address multiplexer 56 to generate the row address. For example, the row address multiplexer 56 may multiplex one or more signals from the refresh address counter 54 and one or more signals from the external address input 52. The row address multiplexer 56 may output one or more refresh address signals to the disturb recovery address multiplexer 60. Also, the disturb recovery address multiplexer 60 may be coupled to the disturb recovery address counter 58. The disturb recovery address multiplexer 60 may multiplex the one or more refresh address signals from the row address multiplexer 56 and one or more disturb recovery address signals from the disturb recovery address counter 58. The disturb recovery address multiplexer 60 may output one or more disturb recovery refresh address signals to the row decoder 62. The row decoder 62 may decode the one or more disturb recovery refresh address signals and provide one or more decoded disturb recovery refresh address signals (e.g., word line (WL) 28 and/or source line (SL) 30) to the matrices 40*a-n* of memory cells 12.

The disturb recovery address counter 58 may store disturb recovery row address information. For example, in a source line (SL) plate configuration and/or a ganged source line (SL) configuration, a plurality of unselected memory cells 12 may be disturbed for one or more operations performed on the one or more selected memory cells 12. For example, the plurality of unselected memory cells 12 may be coupled to a plurality of word lines (WL) 28 (e.g., arranged in different rows). During a refresh cycle, one or more unselected memory cells 12 coupled to a word line (WL) 28 (e.g., each row) may be refreshed. The refresh cycle may repeat and one or more unselected memory cells coupled to another word line (WL) 28 (e.g., another row) may be refreshed. The disturb recovery address counter 58 may increment or toggle to a next disturb recovery row address each time an operation is performed during an operation/access cycle. This process may repeat itself until all unselected memory cells 12 coupled to different word lines (WL) 28 (e.g., all rows) are refreshed and the disturb recovery address counter 58 is reset or cleared.

In an exemplary embodiment, 512 word lines (WL) 28 (e.g., rows) may be coupled to a plurality of memory cells, each of which in turn is coupled to a source line (SL) 30. Thus, in the event that one or more operations may be performed on one or more memory cells 12 via the source line (SL) 30 during an operation/access cycle, one or more memory cells 12 coupled to the 512 word lines (WL) 28 (e.g., rows) may be refreshed in order to reduce the disturbance.

In each operation/access cycle, memory cells 12 that are coupled to a word line (WL) 28 (e.g., word line (0)) may be refreshed, and the disturb recovery address counter 58 may be incremented or toggled to a next disturb recovery row address (e.g., from counter (0) to counter (1)). The disturb recovery address counter 58 may increment or toggle to a next disturb recovery row address until all of the memory cells 12 that are coupled to all the word lines (WL) 28 (e.g., all rows) are refreshed. The disturb recovery address counter 58 may track the number of word lines (WL) (e.g., rows) coupled to the memory cells 12 to be refreshed during the operation/access cycle.

Also, the semiconductor memory device 10 may include a plurality of local data sense amplifiers 64 coupled to the plurality of matrices 40*a-n* of memory cells 12 via one or more local bit lines (BL) 32, one or more data sense amplifier selection circuits 66 coupled to the plurality of local data sense amplifiers 64, one or more global data sense amplifiers 68 coupled to the plurality of local data sense amplifiers 64 via one or more global bit lines (GBL) 74, and/or an input/out (I/O) buffer 70 to output data signals representing data states stored in the memory cells 12 via a data output (DQ). For example, each data sense amplifier selection circuit 66 may enable a corresponding local data sense amplifier 64 to determine a data state stored in one or more memory cells 12 via the one or more local bit lines (BL) 32. The data state determined by each local data sense amplifier 64 may be transferred to a corresponding global data sense amplifier 68 via the one or more global bit lines (GBL) 74. Each global data sense amplifier 68 may output the data state via the input/output (I/O) buffer 70 and/or the data output (DQ).

In an exemplary embodiment, the plurality of local data sense amplifiers 64 may be arranged in a plurality of banks of local data sense amplifiers 64 coupled to the plurality of matrices 40*a-n* of memory cells 12. For example, each bank of local data sense amplifier 64 may be coupled to a matrix 40 of memory cells 12. Each local data sense amplifier 64 may sense a data state (e.g., logic high (binary data state "1") or logic low (binary data state "0")) stored in a memory cell 12. The plurality of local data sense amplifiers 64 may be controlled by the one or more data sense amplifier selection circuits 66. The data state stored in a memory cell 12 may be detected by and/or stored in a corresponding local data sense amplifier 64. Each local data sense amplifier 64 may provide the data state of a memory cell 12 to the one or more global data sense amplifiers 68 via the one or more global bit lines (GBL) 74. Each global data sense amplifier 68 may output the data state of a memory cell 12 via the input/output (I/O) buffer 70 and/or the data output (DQ).

Figure 3:
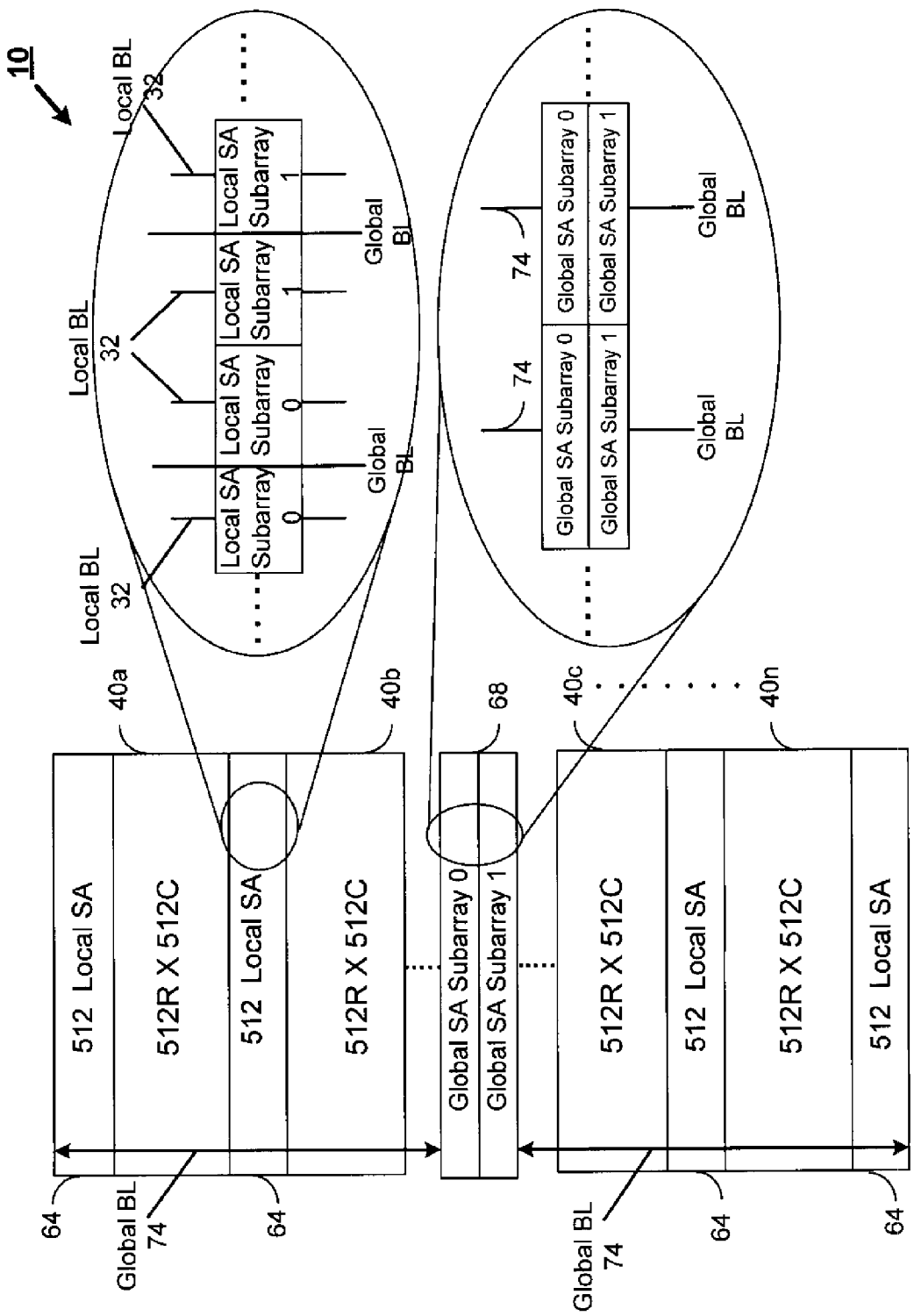
FIG. 3 shows a detailed schematic block diagram of a plurality of matrices of memory cells, a plurality of local data sense amplifiers, and a plurality of global data sense amplifiers in accordance with an embodiment of the present disclosure.

Referring to FIG. 3, there is shown a detailed schematic block diagram of a plurality of matrices 40*a-n* of memory cells 12, a plurality of local data sense amplifiers 64, and a plurality of global data sense amplifiers 68 in accordance with an embodiment of the present disclosure. The plurality of matrices 40*a-n* of memory cells 12 may be coupled to the plurality of local data sense amplifiers 64 via one or more local bit lines (BL) 32. The plurality of global data sense amplifiers 68 may be coupled to the plurality of local data sense amplifiers 64 via one or more global bit lines (GBL) 74.

The size of the plurality of matrices 40*a-n* of memory cells 12 may vary depending one or more parameters (e.g., power consumption, size of semiconductor material, spacing of memory cells, and/or parameters that may affect the size of a matrix of memory cells). In an exemplary embodiment, a matrix of memory cells 12 of the plurality of matrices 40*a-n* of memory cells 12 may include 512 rows and 512 columns of memory cells 12.

The plurality of local data sense amplifiers 64 may be arranged into one or more banks of local data sense amplifiers 64. Each bank of local data sense amplifiers 64 may be associated with each matrix 40 of memory cells 12 of the plurality of matrices 40*a-n* of memory cells 12. Also, each bank of local data sense amplifiers 64 may be arranged into one or more subarrays of local data sense amplifiers 64. In an exemplary embodiment, each bank of local data sense amplifiers 64 may be arranged in two subarrays of local data sense amplifiers 64 (e.g., local data sense amplifier subarray 0 and local data sense amplifier subarray 1). The plurality of local data sense amplifiers 64 may be coupled to the memory cells 12 via local bit lines (BL) 32. Also, the plurality of local data sense amplifiers 64 may be coupled to the plurality of global data sense amplifiers 68 via global bit lines (GEL) 74.

Also, the plurality of global data sense amplifiers 68 may be arranged in one or more banks of global data sense amplifiers 68. For example, one or more banks of local data sense amplifiers 64 may be associated with a bank of the global data sense amplifiers 68. Also, each bank of the global data sense amplifiers 68 may be arranged in one or more subarrays of global data sense amplifiers 68. In an exemplary embodiment, each bank of the global data sense amplifier 68 may include two subarrays of the global data sense amplifier 68 (e.g., global data sense amplifier subarray 0 and global data sense amplifier subarray 1). For example, a global data sense amplifier subarray 0 may be associated with a local data sense amplifier subarray 0 and a global data sense amplifier subarray 1 may be associated with a global data sense amplifier subarray 1.

In another exemplary embodiment, a plurality of local data sense amplifier subarrays may be coupled to a single global data sense amplifier subarray via a global bit line (GBL) 74. For example, by coupling a plurality of local data sense amplifier subarrays to a single global data sense amplifier subarray, the pitch of the global bit lines (GBL) 74 may be reduced and thus may avoid yield problem caused by high pitch global bit lines (GBL) 74. As shown in FIG. 3, two local data sense amplifier subarrays (e.g., local data sense amplifier subarray 0 and/or local data sense amplifier subarray 1) may be coupled to a single global data sense amplifier subarray (e.g., global data sense amplifier subarray 0 and/or global data sense amplifier subarray 1) via a global bit line (GBL) 74.

In an exemplary embodiment, disturbance caused by an operation/access cycle (e.g., read, write, sense, refresh, and/or other operations) on a memory cell 12 may be reduced by dividing the operation/access cycle into a plurality of segments. For example, the operation/access cycle may be divided into an operation segment and a disturbance recovery segment. During the operation segment of the operation/access cycle, one or more selected memory cells 12 may be accessed and one or more operations may be performed. During the disturbance recovery segment of the operation/access cycle, a refresh operation (e.g., a read operation and a write back operation) may be performed to one or more unselected memory cells 12 to equalize any disturbance on the one or more unselected memory cells 12 caused by the operation on the one or more selected memory cells 12.

The disturbance recovery segment may be performed at any time during the operation/access cycle. In an exemplary embodiment, the disturbance recovery segment may be performed during the operation segment of the operation/access cycle. For example, the operation segment of the operation/access cycle may include a plurality of operations (e.g., one or more read operations, one or more precharge operations, one or more sense operations, and/or one or more write operations) performed on one or more selected memory cells 12. Also, the disturbance recovery segment of the operation/access cycle may include a refresh operation (e.g., a read operation and a write operation) performed on one or more unselected memory cells 12. In an exemplary embodiment, the disturbance recovery segment of the operation/access cycle may be performed after a first operation (e.g., a read operation) of the operation segment but before a second operation (e.g., a write operation) of the operation segment.

The operation/access cycle may start by performing an operation during the operation segment. In an exemplary embodiment, the operation segment may include a plurality of operations, and a read operation may be performed to start the operation/access cycle. For example, the read operation may be performed by applying control signals on one or more word lines (WL) 28 and/or source lines (SL) 30 generated by the memory cell selection and control circuitry 38 to one or more selected memory cells 12. One or more local data sense amplifiers 64 coupled to the one or more selected memory cells 12 may determine data states (e.g., logic low (binary "0" data state) or logic high (binary "1" data state)) stored in the one or more selected memory cells 12. Data states of the one or more selected memory cells 12 determined by the one or more local data sense amplifiers 64 may be transferred to one or more global data sense amplifiers 68 via the global bit lines (GBL) 74. For example, local data sense amplifier subarray 0 may transfer the data states of one or more selected memory cells 12 to global data sense amplifier subarray 0 via the global bit lines (GBL) 74. Also, local data sense amplifier subarray 1 may transfer the data states of one or more selected memory cells 12 to global data sense amplifier subarray 1 via global bit lines (GBL) 74.

In another embodiment, the local data sense amplifiers 64 may transfer the data states of one or more selected memory cells 12 to the global data sense amplifiers 68 sequentially. For example, local data sense amplifier subarray 0 may transfer the data states of one or more selected memory cells 12 to global data sense amplifier subarray 0 first before local data sense amplifier subarray 1 may transfer the data states of one or more selected memory cells 12 to global data sense amplifier subarray 1.

After an initial operation (e.g., read operation) of the operation segment is performed, the operation/access cycle may perform the disturbance recovery segment. For example, the disturbance recovery segment may include a refresh operation having a read operation and a writeback operation. In an exemplary embodiment, the memory cell selection and control circuitry 38 may transmit one or more control signals on one or more word lines (WL) 28 and/or source lines (SL) 30 to one or more unselected memory cells 12. For example, the one or more unselected memory cells 12 may include one or more memory cells 12 that may be coupled to the same source line (SL) 30 as the one or more selected memory cells 12. The local data sense amplifiers 64 may determine a data state stored in the one or more unselected memory cells 12 and perform a writeback operation to the one or more disturbed memory cells 12 during an operation/access cycle. During a normal operation/access cycle without a disturbance recovery segment, the maximum number of disturb cycles received by the memory cells 12 may be equal to a refresh interval divided by an operation/access cycle time. For example, if the refresh interval is 64 milliseconds and the operation/access cycle time is 50 nanoseconds, then the maximum number of disturb cycles received the memory cells 12 is equal to 1.28 million (e.g., 64 ms/50 ns) memory cells 12.

In an exemplary embodiment, the maximum number of disturb cycles received by the memory cells 12 with a disturbance recovery segment during an operation/access cycle may be reduced and may vary based at least in part on source line (SL) 30 configurations. For example, in a single source line (SL) configuration (e.g., two memory cells 12 share a source line (SL) 30), a maximum number of disturb cycles received by the memory cells 12 to be refreshed during a disturbance recovery segment of an operation/access cycle may be one. In a source line (SL) plate configuration (e.g., a plurality of memory cells 12 coupled to a source line (SL) plate), a maximum number of disturb cycles received by the memory cells 12 to be refreshed during a disturbance recovery segment of an operation/access cycle may be equal to a total number of rows of memory cells 12 coupled to the source line (SL) plate multiplied by two, minus one. For example, in the event that 512 rows of memory cells 12 are coupled to a source line (SL) plate, a maximum number of disturbed cycles received by the memory cells during a disturbance recovery segment of an operation/access cycle may be 1023 (e.g., 512×2-1).

In a ganged source line (SL) configuration (e.g., a plurality of source lines (SL) 30 are coupled together), a maximum number of disturb cycles received by the memory cells to be refreshed during a disturbance recovery segment of an operation/access cycle may be equal to a number of source lines (SL) coupled together multiplied by 4, minus 1. For example, in the event that 16 source lines (SL) 30 are coupled together, a maximum number of disturb cycles of received by the memory cells 12 to be refreshed during a disturbance recovery segment may be 63 (e.g., 16×4-1).

After performing a disturbance recovery segment, the operation segment of the operation/access cycle may be resumed, and a second operation (e.g., a writeback operation) may be performed. In an exemplary embodiment, the global data sense amplifiers 68 may transfer the data states of one or more selected memory cells 12 back to the local data sense amplifiers 64 via the global bit lines (GBL) 74 during an initiation period of the writeback operation. For example, the global data sense amplifiers 68 may transfer the data states of one or more selected memory cells 12 back to the local data sense amplifiers 64 during a pre-charge period of the writeback operation. The global data sense amplifiers 68 may transfer the data states of one or more selected memory cells 12 back to the local data sense amplifiers 64 in a opposite manner as the local data sense amplifiers 64 transfer the data states of one or more selected memory cells 12 to the global data sense amplifiers 68, as discussed above.

The local data sense amplifiers 64 may receive the data states of one or more selected memory cells 12 from the global data sense amplifiers 68 and the local data sense amplifiers 64 may be pre-charged to a predetermined voltage/current level. The local data sense amplifiers 64 may write the data states of the one or more selected memory cells 12 back to the one or more selected memory cells 12 to complete a writeback operation.

Figure 4:
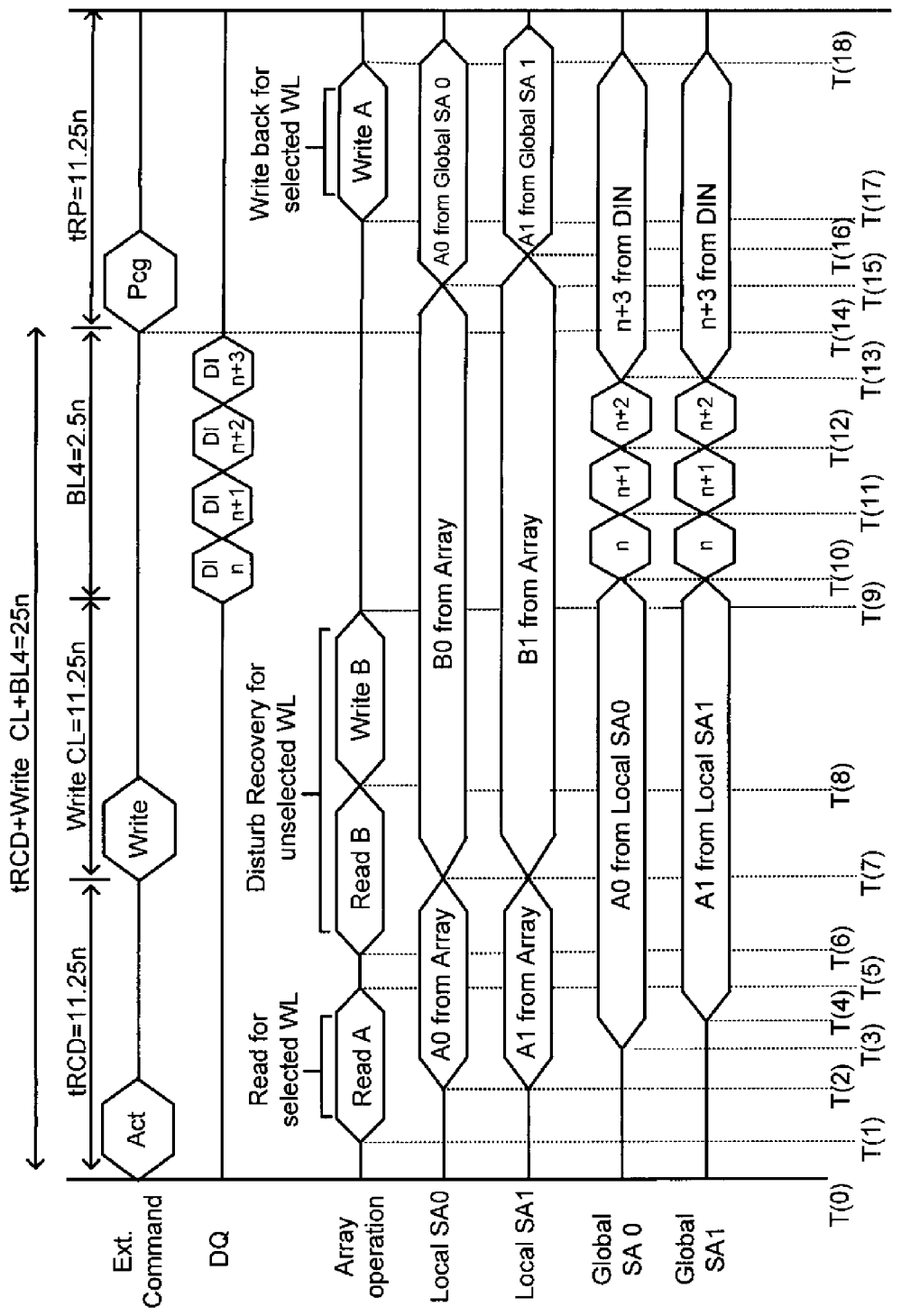
FIG. 4 shows a timing and operation diagram of a semiconductor memory device in accordance with an embodiment of the present disclosure.

Referring to FIG. 4, there is shown a timing and operation diagram of a semiconductor memory device in accordance with an embodiment of the present disclosure. As discussed above, during an operation/access cycle, one or more operations may be performed on the plurality of matrices 40*a-n* of memory cells 12 based on one or more active commands. For example, during an operation/access cycle, one or more active commands may include an active command (Act) to activate the plurality of matrices 40*a-n* of memory cells 12 to perform one or more operations, a write command (Write) to perform a write operation, and/or a precharge command (Pcg) to precharge one or more data sense amplifiers. For example, at the start T(0) of an operation/access cycle, an active command (Act) may be executed to activate the plurality of matrices 40*a-n* of memory cells 12 to perform one or more operations. In an exemplary embodiment, one or more row signals applied to the plurality of matrices 40*a-n* of memory cells 12 may be established during a time interval (tRCD) between the start of the active command (Act) and the start of an operation command (e.g., write command or read command). As illustrated in FIG. 4, the time interval (tRCD) between the start of the active command (Act) and the start of a write command (Write) may be 11.25 nanoseconds.

At time T(1), one or more read operations may be performed for one or more memory cells 12 coupled to one or more selected word lines (WL) 28. For example, one or more read control signals may be applied to one or more selected memory cells 12 via word lines (WL) 28, source lines (SL) 30, and/or bit lines (BL) 32.

At time T(2), a plurality of local data sense amplifiers 64 may be enabled. For example, a plurality of local data sense amplifiers 64 coupled to the one or more selected memory cells 12 may be enabled to detect data states (e.g., logic low (binary data state "0" or logic high (binary data state "1") stored in the one or more selected memory cells 12. As illustrated in FIG. 4, local data sense amplifier subarray (A0) and the local data sense amplifier subarray (A1) may be enabled to detect data states (e.g., logic low (binary data state "0") or logic high (binary data state "1")) stored in the one or more selected memory cells 12. Also, the data states of the one or more selected memory cells 12 may be stored in the plurality of local data sense amplifiers 64.

At times T(3) and T(4), the plurality of local data sense amplifiers 64 may transfer the data state of the one or more selected memory cells 12 to the global data sense amplifiers 68. In an exemplary embodiment, the plurality of local data sense amplifiers 64 may transfer the data state of the one or more selected memory cells 12 to the global data sense amplifiers 68 sequentially. For example, at time T(3), local data sense amplifier subarray (A0) may transfer the data states of one or more selected memory cells 12 to global data sense amplifier subarray 0 via the global bit lines (GBL) 74. Also, at time T(4), local data sense amplifier subarray (A1) may transfer the data state of the one or more selected memory cells 12 to global data sense amplifier subarray 1 via the global bit lines (GBL) 74.

At time T(5), the one or more read operations performed on the one or more memory cells 12 coupled to one or more selected word lines (WL) 28 may be completed.

At time T(6), a disturbance recovery segment of the operation/access cycle may be performed on one or more unselected memory cells 12 (e.g., coupled to previously unselected word lines (WL) 28). In an exemplary embodiment, the disturbance recovery segment may include a read operation and a writeback operation. At time T(6), a read operation may be performed on one or more unselected memory cells 12 coupled to one or more previously unselected word lines (WL) 28 (e.g., one or more unselected memory cells 12). For example, one or more read control signals may be applied to the one or more unselected memory cells 12 via word lines (WL) 28, source lines (SL) 30, and/or bit lines (BL) 32.

At time T(7), a plurality of local data sense amplifiers 64 may be enabled. For example, a plurality of local data sense amplifiers 64 coupled to the one or more unselected memory cells 12 may be enabled to detect data states (e.g., logic low (binary data state "0") or logic high (binary data state "1")) stored in the one or more unselected memory cells 12. As illustrated in FIG. 4, local data sense amplifier subarray (A0) and local data sense amplifier subarray (A1) may be enabled to detect data states (e.g., logic low (binary data state "0") or logic high (binary data state "1")) stored in the one or more unselected memory cells 12. Also, the data states of the one or more unselected memory cells 12 may be stored in the plurality of local data sense amplifiers 64.

At times T(8) and T(9), the plurality of local data sense amplifiers 64 storing the data states of the one or more unselected memory cells 12 may perform a writeback operation. For example, the plurality of local data sense amplifiers 64 may write the detected data states back to the one or more unselected memory cells 12. At time T(9), the plurality of local data sense amplifiers 64 may complete the writeback operation.

At times T(10)-T(13), a plurality of bursts of data may be stored in the plurality of global data sense amplifiers 68. In an exemplary embodiment, four bursts of data may be stored in the plurality of global data sense amplifiers 68. The four bursts of data may be stored in global data sense amplifier subarray 0 and/or the global data sense amplifier subarray 1.

At time T(14), the precharge command (Pcg) may be executed. For example, the plurality of the local data sense amplifiers 64 may be precharged in preparation to perform one or more operations (e.g., write operation). As illustrated in FIG. 4, the precharge interval (tRP) may be 11.25 nanoseconds.

At times T(15) and T(16), the plurality of global data sense amplifiers 68 may transfer the data states of the one or more selected memory cells 12 back to the local data sense amplifiers 64. In an exemplary embodiment, the plurality of global data sense amplifiers 68 may transfer the data states of the one or more selected memory cells 12 back to the local data sense amplifiers 64 sequentially. For example, at time T(15), global data sense amplifier subarray 0 may transfer the data states of one or more selected memory cells 12 back to local data sense amplifier subarrays (A0) via the global bit lines (GBL) 74. Also, at time T(16), global data sense amplifier subarray 1 may transfer the data states of one or more selected memory cells 12 back to local data sense amplifier subarray (A1) via the global bit lines (GBL) 74.

At times T(17) and T(18), the plurality of local data sense amplifiers 64 storing the data states of the one or more selected memory cells 12 may perform a writeback operation. For example, the plurality of local data sense amplifiers 64 may write the data states received from the plurality of global data sense amplifiers 68 to the one or more selected memory cells 12. At time T(18), the plurality of local data sense amplifiers 64 may complete the writeback operation to the one or more selected memory cells 12.

At this point it should be noted that reducing disturbance in a semiconductor memory device in accordance with the present disclosure as described above typically involves the processing of input data and the generation of output data to some extent. This input data processing and output data generation may be implemented in hardware or software. For example, specific electronic components may be employed in a semiconductor memory device or similar or related circuitry for implementing the functions associated with reducing disturbance in a semiconductor memory device in accordance with the present disclosure as described above. Alternatively, one or more processors operating in accordance with instructions may implement the functions associated with reducing a voltage swing in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed:

1. A semiconductor memory device comprising:
    a plurality of memory cells arranged in arrays of rows and columns; and
    a plurality of data sense amplifiers, coupled to the plurality of memory cells, configured to perform one or more operations during an operation/access cycle, wherein the operation/access cycle comprises an operation segment associated with one or more selected memory cells and a disturbance recovery segment associated with one or more unselected memory cells, wherein the operation segment comprises a read operation and a writeback operation, and wherein the disturbance recovery segment occurs in between the read operation and the writeback operation of the operation segment.

2. The semiconductor memory device according to claim 1, wherein the plurality of data sense amplifiers comprise a plurality of local data sense amplifiers coupled a plurality of global data sense amplifiers via one or more global bit lines.

3. The semiconductor memory device according to claim 2, wherein the plurality of local data sense amplifiers are arranged in one or more local data sense amplifier subarrays 0 and one or more local data sense amplifier subarrays 1, and the plurality of global data sense amplifiers are arranged in one or more global data sense amplifier subarrays 0 and one or more global data sense amplifier subarrays 1.

4. The semiconductor memory device according to claim 2, wherein the plurality of local data sense amplifiers are coupled to a single global data sense amplifier via a single global bit line.

5. The semiconductor memory device according to claim 2, wherein the plurality of local data sense amplifiers are configured to determine a data state stored in the one or more selected memory cells during the operation segment of the operation/access cycle.

6. The semiconductor memory device according to claim 5, wherein the plurality of local data sense amplifiers are configured to transfer the data state stored in the one or more selected memory cells to the plurality of global data sense amplifiers.

7. The semiconductor memory device according to claim 6, wherein the plurality of local data sense amplifiers are configured to determine a data state stored in the one or more unselected memory cells.

8. The semiconductor memory device according to claim 7, wherein the plurality of local data sense amplifiers are configured to writeback the determined data state to the one or more unselected memory cells.

9. The semiconductor memory device according to claim 8, wherein the plurality of global data sense amplifiers are configured to transfer the data state of the one or more selected memory cells back to the plurality of local data sense amplifiers.

10. The semiconductor memory device according to claim 1, wherein the disturbance recovery segment of the operation/access cycle comprises a read operation and a writeback operation.

11. The semiconductor memory device according to claim 1, further comprising a disturb recovery address counter configured to provide a disturb recovery row address to the plurality of memory cells.

12. A method for reducing disturbance in a semiconductor memory device comprising the steps of:
providing a plurality of memory cells in arrays of rows and columns; and
performing one or more operations during an operation/access cycle, via a plurality of data sense amplifiers, on the plurality of memory cells, wherein the operation/access cycle comprises an operation segment associated with one or more selected memory cells and a disturbance recovery segment associated with one or more unselected memory cells, wherein the operation segment comprises a read operation and a writeback operation, and wherein the disturbance recovery segment occurs in between the read operation and the writeback operation of the operation segment.

13. The method of claim 12, wherein the one or more operations are performed during the operation segment of the operation/access cycle and the disturbance recovery segment includes a read operation and a write operation.

14. The method of claim 12, wherein the plurality of data sense amplifiers include a plurality of local data sense amplifiers and a plurality of global data sense amplifiers.

15. The method according to claim 14, further comprising determining a data state stored in the one or more selected memory cells, via the plurality of local data sense amplifiers, during the operation segment of the operation/access cycle.

16. The method according to claim 15, further comprising transferring the data state stored in the one or more selected memory cells to the plurality of global data sense amplifiers.

17. The method according to claim 16, further comprising determining a data state stored in the one or more unselected memory cells via the plurality of local data sense amplifiers.

18. The method according to claim 17, further comprising writing the determined data state back to the one or more unselected memory cells.

19. The method according to claim 18, further comprising transferring the data state of the one or more selected memory cells from the global data sense amplifiers back to the plurality of local data sense amplifiers.

20. The method according to claim 12, further comprising providing a disturb recovery row address to the plurality of memory cells via a disturb recovery address counter.

* * * * *

UNITED STATES PATENT AND TRADEMARK OFFICE
CERTIFICATE OF CORRECTION

PATENT NO. : 8,174,881 B2  
APPLICATION NO. : 12/624856  
DATED : May 8, 2012  
INVENTOR(S) : Jungtae Kwon et al.

Page 1 of 1

It is certified that error appears in the above-identified patent and that said Letters Patent is hereby corrected as shown below:

On the Title page, in field (54) and Column 1, line 2, "Title", after "SEMICONDUCTOR" insert -- MEMORY --.

In column 13, line 6, in Claim 2, after "coupled" insert -- to --.

Signed and Sealed this
Fourteenth Day of August, 2012

David J. Kappos
*Director of the United States Patent and Trademark Office*